(12) United States Patent
Daigo

(10) Patent No.: US 9,712,148 B2
(45) Date of Patent: Jul. 18, 2017

(54) SWITCHING DEVICE DRIVING APPARATUS

(71) Applicant: Mitsubishi Electric Corporation, Chiyoda-ku, Tokyo (JP)

(72) Inventor: Toru Daigo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/620,932

(22) Filed: Feb. 12, 2015

(65) Prior Publication Data

US 2015/0155862 A1  Jun. 4, 2015

Related U.S. Application Data

(62) Division of application No. 13/852,594, filed on Mar. 28, 2013, now Pat. No. 9,041,437.

(30) Foreign Application Priority Data

Oct. 22, 2012  (JP) .................. 2012-232536

(51) Int. Cl.
*H03K 3/00* (2006.01)
*H03K 17/0412* (2006.01)
(Continued)

(52) U.S. Cl.
CPC .......... *H03K 17/04126* (2013.01); *H03K 17/04123* (2013.01); *H03K 17/14* (2013.01); *H03K 17/161* (2013.01)

(58) Field of Classification Search
CPC .......... H03K 2017/0806; H03K 17/14; H03K 17/0822
(Continued)

(56) References Cited

U.S. PATENT DOCUMENTS 4,808,853 A * 2/1989 Taylor .............. H03K 19/09429
326/119
4,837,457 A * 6/1989 Bergstrom ............... H03K 4/64
327/482
(Continued)

FOREIGN PATENT DOCUMENTS

JP    62-085680 A    4/1987
JP    04-372586 A   12/1992
(Continued)

OTHER PUBLICATIONS

German Office Action, issued Jun. 12, 2013, Patent Application No. 10 2013 202 396.0.
Japanese Office Action dated Nov. 26, 2013 issued in Japanese Patent Application No. 2012-232536.

*Primary Examiner* — Ryan Jager
(74) *Attorney, Agent, or Firm* — Sughrue Mion, PLLC; Richard C. Turner

(57) ABSTRACT

A switching device driving apparatus for preventing arm short circuit is provided, including: a first switching device driving unit for receiving a control signal for controlling a first switching device and a second switching device so that they will not turn ON at the same time and outputting an ON/OFF drive signal to the first switching device; and a second switching device driving unit for receiving the control signal and outputting an ON/OFF drive signal to the second switching device, in which the first switching device driving unit outputs a drive signal for increasing the delay of the ON timing of the first switching device with respect to the OFF timing of the second switching device with increase in ambient temperature.

4 Claims, 9 Drawing Sheets

(51) Int. Cl.
*H03K 17/14* (2006.01)
*H03K 17/16* (2006.01)

(58) Field of Classification Search
USPC .................................................. 327/108–112
See application file for complete search history.

(56) References Cited

U.S. PATENT DOCUMENTS

| | | | | |
|---|---|---|---|---|
| 6,262,618 | B1* | 7/2001 | Maggiolino | H02M 1/38 327/271 |
| 7,400,163 | B2* | 7/2008 | Yanagigawa | H02M 1/38 323/282 |
| 8,519,747 | B2* | 8/2013 | Cho | H03K 17/162 327/108 |
| 2003/0001630 | A1* | 1/2003 | Sakata | H02M 1/08 327/108 |
| 2003/0206040 | A1 | 11/2003 | Sakata et al. | |
| 2005/0122152 | A1* | 6/2005 | Yoshida | H03K 3/02337 327/285 |
| 2006/0290401 | A1* | 12/2006 | Yanagigawa | H02M 1/38 327/261 |

FOREIGN PATENT DOCUMENTS

| | | |
|---|---|---|
| JP | 2002-335679 A | 11/2002 |
| JP | 2003-033048 A | 1/2003 |
| JP | 2009-290812 A | 12/2009 |

\* cited by examiner

SWITCHING DEVICE DRIVING APPARATUS

CROSS-REFERENCE TO RELATED APPLICATIONS

This is a Divisional of U.S. application Ser. No. 13/852,594 filed Mar. 28, 2013, which claims priority from Japanese Patent Application No. 2012-232536, filed on Oct. 22, 2012. The disclosures of the prior applications are incorporated herein by reference in their entirety.

BACKGROUND OF THE INVENTION

Field of the Invention

The present invention relates to a switching device driving apparatus that drives a switching device on receiving a control signal, and particularly relates to a switching device driving apparatus that performs synchronous rectification control of a first and second switching devices connected in series included in a switching apparatus.

Description of the Related Art

An inverter or the like for controlling a motor performs drive control of a motor by controlling a switching apparatus to switch current supply paths to coils of the motor. A transformer or the like transforms a voltage generated by a power supply into any desired voltage by controlling a switching apparatus to adjust the current supply amount from the power supply to a reactor (coil).

A switching apparatus includes a first switching device and a second switching device connected in series and provides current from the connecting point of the first and second switching devices as an output unit to a reactor connected thereto. In order to drive the first and second switching devices of the switching apparatus, a switching device driving apparatus is required.

One switching device driving apparatus of this type is a switching device driving apparatus that performs synchronous rectification control of the first switching device and the second switching device. Synchronous rectification control is a control method in which, when the first switching device is ON, the second switching device is caused to be OFF, and when the first switching device is OFF, the second switching device is caused to be ON. For this control method, an invention has been proposed that provides a delay (dead time) in order to avoid overlapping of the conducting period (hereinafter referred to as ON period) of the second switching device with the ON period of the first switching device (in other words, in order to avoid what is called arm short circuit).

For example, JP-A-2002-335679 discloses a switching device driving apparatus that includes a circuit for splitting a common control signal into two and inverting one of them and a delay circuit for delaying the rising or falling of the control signal, and performs synchronous rectification control of a first switching device and a second switching device. This switching device driving apparatus provides a dead time to avoid arm short circuit by delaying the rising or falling of the control signal.

Furthermore, for example, JP-A-2009-290812 discloses a switching device driving apparatus that includes a circuit for detecting a edge of output signals of a first switching device and a second switching device, a circuit for adjusting the voltage of the detected edges, a comparative circuit for comparing the adjusted edges to determine a delay amount and a circuit for providing a delay to a control signal depending on the delay amount, and performs synchronous rectification control of a first switching device and a second switching device. This switching device driving apparatus provides an amount of delay depending on the detected edges to avoid arm short circuit.

For the switching device driving apparatus disclosed in the JP-A-2002-335679, when the delay is provided by a capacitor, the capacitance may vary due to temperature change, which may not ensure a desired dead time, leading to arm short circuit.

For the switching device driving apparatus disclosed in the JP-A-2009-290812, since a time taken to detect the edge is used as a given dead time, a desired dead time may not be ensured at the start-up depending on ambient temperature, leading to arm short circuit.

Also, even when the rising timing of a signal output from the switching device driving apparatus for driving a switching device is delayed or the rising speed of that signal is decreased with respect to the rising of a signal input to the switching device driving apparatus for controlling the switching device, variation in the devices and the delay of the signal for driving the switching device with respect to the signal for controlling the switching device (output propagation delay) may increase when ambient temperature is high, which may not ensure a desired dead time, leading to arm short circuit.

The shorter the dead time is, the more efficient the switching apparatus is. But, when the desired dead time is not ensured, causing arm short circuit, the switching device will be burnt and, at worst, a fire will occur. Also, since synchronous rectification is often used for a DC-DC converter for transforming a voltage generated by an electric generator into a voltage suitable for an equipment connected thereto or often used for an inverter for controlling a motor, the arm short circuit may cause the power supply or the motor to be stopped, even though a fire will not occur.

SUMMARY OF THE INVENTION

In order to solve the problem as described above, it is an object of the present invention to provide a switching device driving apparatus that avoids overlapping of the ON period of a second switching device with the ON period of a first switching device even when ambient temperature increases, to prevent arm short circuit.

In accordance with the invention, a switching device driving apparatus for performing synchronous rectification control of first and second switching devices connected in series included in a switching apparatus is provided, the switching device driving apparatus including:

a first control signal input terminal to which a control signal of the first switching device is input; a second control signal input terminal to which a control signal of the second switching device is input; a first switching device driving unit for receiving the control signal from the first control signal input terminal and outputting an ON/OFF drive signal to the first switching device; and a second switching device driving unit for receiving the control signal from the second control signal input terminal and outputting an ON/OFF drive signal to the second switching device, in which the control signals input to the first and second control signal input terminals are control signals for controlling the first switching device and the second switching device so that they will not turn ON at the same time, and the first switching device driving unit outputs a drive signal for increasing the delay of the ON timing of the first switching device with respect to the OFF timing of the second switching device with increase in ambient temperature.

Furthermore, in accordance with the invention, a switching device driving apparatus for performing synchronous rectification control of first and second switching devices connected in series included in a switching apparatus is provided, the switching device driving apparatus including:

a first control signal input terminal to which a control signal of the first switching device is input; a second control signal input terminal to which a control signal of the second switching device is input; a first switching device driving unit for receiving the control signal from the first control signal input terminal and outputting an ON/OFF drive signal to the first switching device; and a second switching device driving unit for receiving the control signal from the second control signal input terminal and outputting an ON/OFF drive signal to the second switching device, in which the control signals input to the first and second control signal input terminals are control signals for controlling the first switching device and the second switching device so that they will not turn ON at the same time, and the second switching device driving unit outputs a drive signal for increasing the delay of the ON timing of the second switching device with respect to the OFF timing of the first switching device with increase in ambient temperature.

Furthermore, in accordance with the invention, a switching device driving apparatus for performing synchronous rectification control of first and second switching devices connected in series included in a switching apparatus is provided, the switching device driving apparatus including:

a first control signal input terminal to which a control signal of the first switching device is input; a second control signal input terminal to which a control signal of the second switching device is input; a first switching device driving unit for receiving the control signal from the first control signal input terminal and outputting an ON/OFF drive signal to the first switching device; and a second switching device driving unit for receiving the control signal from the second control signal input terminal and outputting an ON/OFF drive signal to the second switching device, in which the control signals input to the first and second control signal input terminals are control signals for controlling the first switching device and the second switching device so that they will not turn ON at the same time, and the first switching device driving unit outputs a drive signal for decreasing the ON switching speed of the first switching device with respect to the OFF switching speed of the second switching device with increase in ambient temperature.

Furthermore, in accordance with the invention, a switching device driving apparatus for performing synchronous rectification control of first and second switching devices connected in series included in a switching apparatus is provided, the switching device driving apparatus including:

a first control signal input terminal to which a control signal of the first switching device is input; a second control signal input terminal to which a control signal of the second switching device is input; a first switching device driving unit for receiving the control signal from the first control signal input terminal and outputting an ON/OFF drive signal to the first switching device; and a second switching device driving unit for receiving the control signal from the second control signal input terminal and outputting an ON/OFF drive signal to the second switching device, in which the control signals input to the first and second control signal input terminals are control signals for controlling the first switching device and the second switching device so that they will not turn ON at the same time, and the second switching device driving unit outputs a drive signal for decreasing the ON switching speed of the second switching device with respect to the OFF switching speed of the first switching device with increase in ambient temperature.

According to the switching device driving apparatus in accordance with the invention, a switching device driving apparatus for preventing arm short circuit even when ambient temperature increases can be provided.

Furthermore, according to the switching device driving apparatus in accordance with the invention, the dead time of the switching device control signal set by the controlling side can be fixed, which allows the use of a controller with a low computational power, thereby allowing low cost control of the switching apparatus. Furthermore, since the dead time can be eliminated when ambient temperature is low, an efficient switching device driving apparatus can be provided.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

A preferred embodiment of a switching device driving apparatus in accordance with the invention is described below with reference to the drawings. Note that, through the drawings, like numerals represent like components.

First Embodiment

Figure 1:
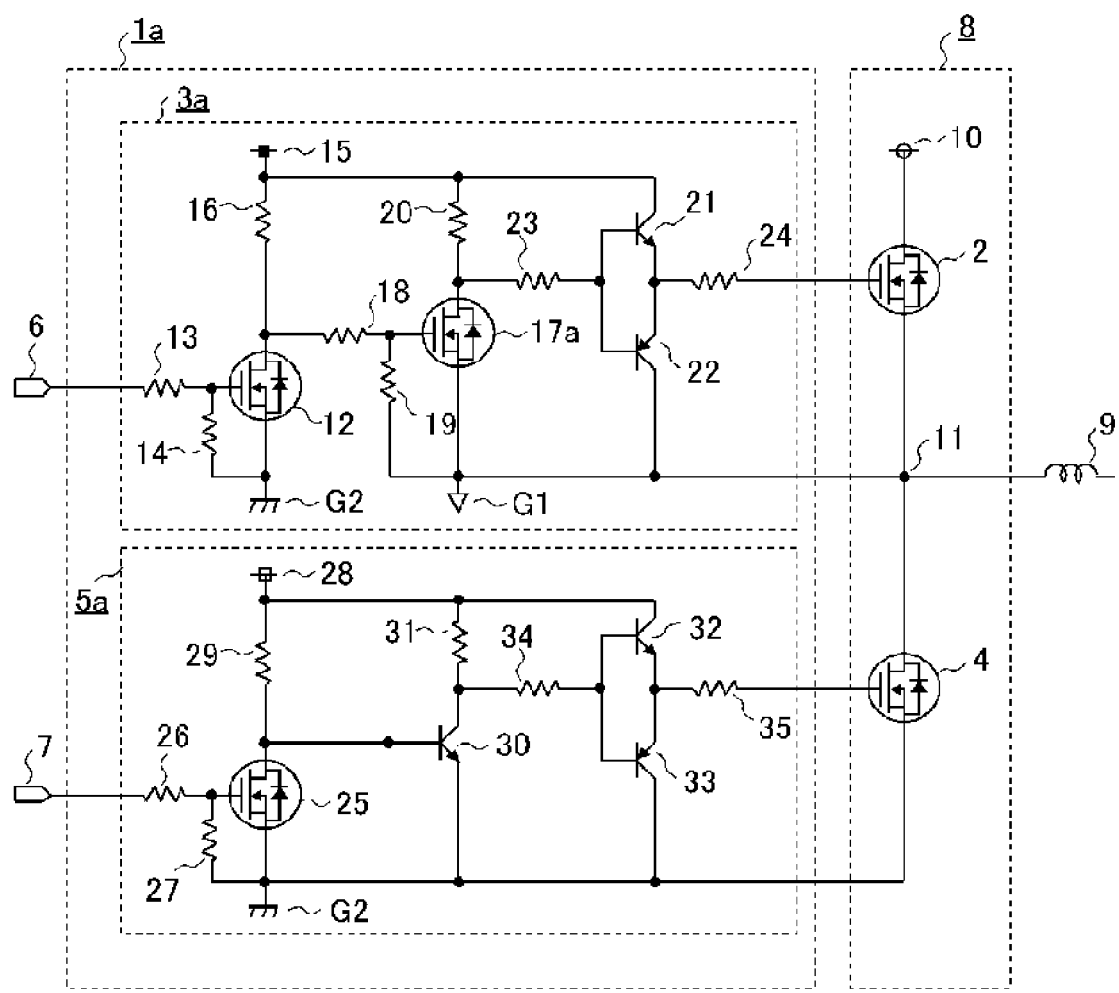
FIG. 1 is a circuit diagram showing an example of a switching device driving apparatus in accordance with a first embodiment of the invention.

FIG. 1 is a circuit diagram showing an example of a switching device driving apparatus in accordance with a first embodiment of the invention.

In FIG. 1, a switching device driving apparatus 1a includes: a first switching device driving unit 3a for driving a first switching device 2 including an N-channel MOSFET; a second switching device driving unit 5a for driving a second switching device 4 including also an N-channel MOSFET; a first control signal input terminal (hereinafter referred to as a first signal input terminal) 6 that is an input terminal for an ON/OFF control signal of the first switching device 2; and a second control signal input terminal (hereinafter referred to as a second signal input terminal) 7 that is an input terminal for an ON/OFF control signal of the second switching device 4. The first switching device 2 and the second switching device 4 form a switching apparatus 8 and are connected to a reactor 9 that stores the energy of a signal output from the switching apparatus 8.

The first switching device driving unit 3a receives a control signal from the first signal input terminal 6 and outputs an ON/OFF drive signal to the first switching device 2. The second switching device driving unit 5a, when ambient temperature is higher than a preset temperature, receives a control signal from the second signal input terminal 7 and outputs an ON/OFF drive signal to the second switching device 4 such that the delay of the ON timing of the output signal with respect to the ON timing of the control signal increases with increase in the temperature.

The switching apparatus 8 includes the first switching device 2 and the second switching device 4 connected in series and is connected to a power supply 10. With a voltage applied by the power supply 10 and drive signals output from the switching device driving apparatus 1a, the switching apparatus 8 turns ON/OFF of the first switching device 2 and the second switching device 4 and outputs a signal from a connecting point 11 of the first switching device 2 and the second switching device 4. Then, the energy of this output signal is stored in the reactor 9.

Next, the first switching device driving unit 3a and the second switching device driving unit 5a are described in detail.

First, the first switching device driving unit 3a includes: a resistor 13 connected between the first signal input terminal 6 and the gate of a third switching device 12; a resistor 14 connected between the gate and the source of the third switching device 12; a resistor 16 connected between a drive power supply 15 for the first switching device driving unit 3a and the drain of the third switching device 12 to limit the drain-source current; a resistor 18 connected between the drain of the third switching device 12 and the gate of a fourth switching device 17a; a resistor 19 connected between the gate and the source of the fourth switching device 17a; and a resistor 20 connected between the drive power supply 15 and the drain of the fourth switching device 17a to limit the drain-source current of the fourth switching device 17a.

The third switching device 12 and the fourth switching device 17a are N-channel MOSFETs. The third switching device 12 is driven by the resistors 13 and 14, and inverts ON/OFF of the control signal input from the first signal input terminal 6 to convert into the drive voltage of the first switching device 2. The fourth switching device 17a is driven by the resistors 18 and 19, and inverts the ON/OFF inverted signal from the third switching device 12 into a signal to be converted to the drive voltage of the first switching device 2.

Furthermore, the first switching device driving unit 3a includes: a resistor 23 connected between the drain of the fourth switching device 17a and the base of a first and second transistors 21, 22 to limit the base current of the first and second transistors 21, 22; and a resistor 24 connected between the emitter of the first and second transistors 21, 22 and the gate of the first switching device 2 to limit the amount of current in the first switching device 2 and adjust the switching speed.

The first transistor 21 is an N-channel bipolar transistor. The second transistor 22 is a P-channel bipolar transistor. In the first transistor 21, the collector is connected to the drive power supply 15, and the emitter is connected to the emitter of the second transistors 22. And, the first transistor 21 is driven so as to charge when the drive signal for the first switching device 2 input by the fourth switching device 17a is ON. On the other hand, in the second transistors 22, the collector is connected to the source of the fourth switching device 17a and a ground G1 of the power supply 10, and is driven so as to discharge when the drive signal for the first switching device 2 input by the fourth switching device 17a is OFF.

Next, the second switching device driving unit 5a includes: a resistor 26 connected between the second signal input terminal 7 and the gate of a fifth switching device 25; a resistor 27 connected between the gate and the source of the fifth switching device 25; a resistor 29 connected between a drive power supply 28 for the second switching device driving unit 5a and the drain of the fifth switching device 25 to limit the drain-source current of the fifth switching device 25; a third transistor 30 that inverts the ON/OFF inverted signal from the fifth switching device 25 into a signal to be converted to the drive voltage of the second switching device 4; and a resistor 31 connected between the drive power supply 28 and the collector of the third transistor 30 to limit the collector-emitter current of the third transistor 30.

The third transistor 30 is an N-channel bipolar transistor. The fifth switching device 25 is an N-channel MOSFET. The fifth switching device 25 is driven by the resistors 26 and 27, and inverts ON/OFF of the control signal input from the second signal input terminal 7 to convert into the drive voltage of the second switching device 4.

Furthermore, the second switching device driving unit 5a includes: a resistor 34 connected between the collector of the third transistor 30 and the base of a fourth and fifth transistors 32, 33 to limit the base current of the fourth and fifth transistors 32, 33; and a resistor 35 connected between the emitter of the fourth and fifth transistors 32, 33 and the gate of the second switching device 4 to limit the amount of current in the second switching device 4 and adjust the switching speed.

The fourth transistor 32 is an N-channel bipolar transistor. The fifth transistor 33 is a P-channel bipolar transistor. In the fourth transistor 32, the collector is connected to the drive power supply 28, and the emitter is connected to the emitter of the fifth transistors 33. And, the fourth transistor 32 is driven so as to charge when the drive signal for the second switching device 4 input by the third transistor 30 is ON. And, the fifth transistor 33 is driven so as to discharge when the drive signal for the second switching device 4 input by the third transistor 30 is OFF.

Note that, in the above, the first switching device 2 and the second switching device 4 are high-voltage power MOSFETs with a large package size, while the third switching device 12, the fourth switching device 17a and the fifth switching device 25 are small-signal MOSFETs with a small package size.

The switching device driving apparatus 1a in accordance with the first embodiment is configured as mentioned above, the operation of which is described below.

Figure 2:
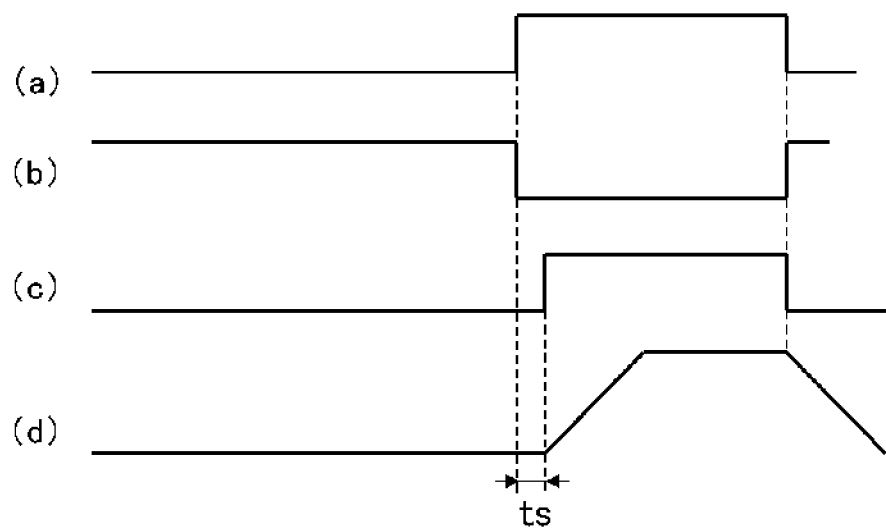
FIG. 2 is a timing chart showing the operation of a second switching device driving unit of the switching device driving apparatus in accordance with the first embodiment of the invention.

FIG. 2 is a timing chart showing the operation of the second switching device driving unit 5a. First, prior to the description of the operation of the second switching device driving unit 5a, the characteristics of a bipolar transistor is described.

In a bipolar transistor, when a voltage is applied between the base and the emitter to cause the input signal to be ON, a current flows between the collector and the emitter to cause the output voltage (collector-emitter voltage) to be 0 V. This means that, with the input signal ON, the bipolar transistor outputs OFF, i.e., the input signal is inverted. On the other hand, when the base-emitter voltage is OV to cause the input signal to be OFF, no current flows between the collector and the emitter, causing the output voltage (collector-emitter voltage) to be equal to a voltage applied to the transistor. This means that, with the input signal OFF, the bipolar transistor outputs ON, i.e., the input signal is inverted.

Also, the bipolar transistor has a storage delay time due to minority carrier storage effect, causing the rising of the output signal to be delayed with respect to the falling of the input signal. Since a MOSFET does not have such a storage delay time, with the input signal ON, the MOSFET outputs OFF (i.e., the input signal is inverted) with a delay much less than that for the bipolar transistor.

Returning to FIG. 2, signal (a) shows the control signal from the second signal input terminal 7 and the gate-source voltage (input signal: Vgs) of the fifth switching device 25. Signal (b) shows the drain-source voltage (output signal: Vds) of the fifth switching device 25 and the base-emitter voltage (input signal: Vbe) of the third transistor 30. Signal (c) shows the collector-emitter voltage (output signal: Vice) of the third transistor 30. Signal (d) shows the gate-source voltage (input signal: Vgs) of the second switching device 4.

The fifth switching device 25 inverts the input signal and outputs to the third transistor 30. The output signal of the third transistor 30 is delayed by a storage delay time ts with respect to the input signal due to minority carrier storage effect. Thus, with respect to a control signal ON input from the second signal input terminal 7, the second switching device driving unit 5a causes the input voltage of the second switching device 4 to be ON with a delay corresponding to a storage delay time ts.

Figure 3:
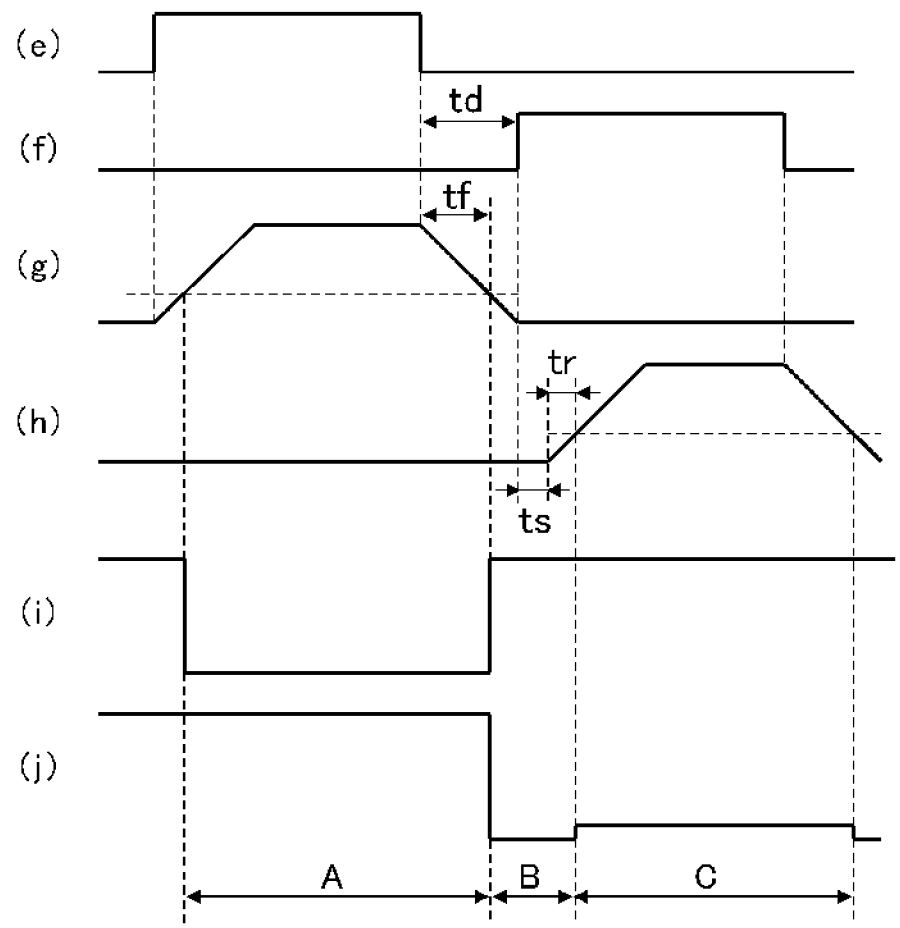
FIG. 3 is a timing chart showing the operation of the switching device driving apparatus and a switching apparatus driven by the switching device driving apparatus in accordance with the first embodiment of the invention.

FIG. 3 is a timing chart showing the operation of the switching device driving apparatus 1a and the switching apparatus 8.

In FIG. 3, signal E shows the control signal from the first signal input terminal 6 and the gate-source voltage (input signal: Vgs) of the third switching device 12. Signal F shows the control signal from the second signal input terminal 7 and the gate-source voltage (input signal: Vgs) of the fifth switching device 25. Signal G shows the gate-source voltage (input signal: Vgs) of the first switching device 2. Signal H shows the gate-source voltage (input signal: Vgs) of the second switching device 4. Signal I shows the drain-source voltage (input signal: Vds) of the first switching device 2. Signal J shows the drain-source voltage (input signal: Vds) of the second switching device 4.

As mentioned above, the control signal from the first signal input terminal 6 is inverted with respect to the control signal from the second signal input terminal 7. Furthermore, between the OFF timing of the control signal from the first signal input terminal 6 and the ON timing of the control signal from the second signal input terminal 7, and between the ON timing of the control signal from the first signal input terminal 6 and the OFF timing of the control signal from the second signal input terminal 7, a dead time td is provided that is set by a control signal for avoiding arm short circuit between the first switching device 2 and the second switching device 4. The dead time td is set such that tf+tr<td, where tf is a time from when the gate-source voltage of the first switching device 2 starts to drop till when that voltage becomes equal to or less than a threshold at room temperature, and tr is a time from when the gate-source voltage of the second switching device 4 starts to rise till when that voltage becomes equal to or more than a threshold.

The first switching device 2 has a large input parasitic capacitance due to a larger package size than the third switching device 12 and so has a slower switching speed (ON/OFF speed of the gate-source voltage) than the third switching device 12. Similarly, the second switching device 4 has a slower switching speed (ON/OFF speed of the gate-source voltage) than the fifth switching device 25. And, as described above, with respect to a control signal ON input from the second signal input terminal 7, the input voltage of the second switching device 4 is caused to be ON with a delay corresponding to the storage delay time ts.

In the first switching device 2, when the gate-source voltage increases to exceed a threshold, continuity is achieved between the drain and the source to cause the drain-source voltage to be 0 V (period A). Accordingly, in the first switching device 2, when the gate-source voltage decreases to fall below the threshold, continuity is broken between the drain and the source to cause the drain-source voltage to be equal to the voltage of the power supply 10. Similarly, in the second switching device 4, when the gate-source voltage increases to exceed a threshold, continuity is achieved between the drain and the source to cause the drain-source voltage to be 0 V (period C). Accordingly, in the second switching device 4, when the gate-source voltage decreases to fall below the threshold, continuity is broken between the drain and the source to cause the drain-source voltage to be equal to the voltage of the power supply 10.

However, when continuity is achieved between the drain and the source of the first switching device 2, the output (drain-source voltage) of the second switching device 4 causes current to flow from the power supply 10 to the reactor 9 to store energy in the reactor 9. The instant at which continuity is broken between the drain and the source of the first switching device 2, the stored energy is caused to flow through a body diode of the second switching device 4 by a counter-electromotive force of the reactor 9, causing a voltage drop corresponding to the forward voltage of the body diode in the drain-source voltage of the second switching device 4 (period B: dead time). If the period B during which continuity is achieved between the drain and the source of the first switching device 2 disappears and the period A overlaps with the period C, arm short circuit will occur.

Figure 4:
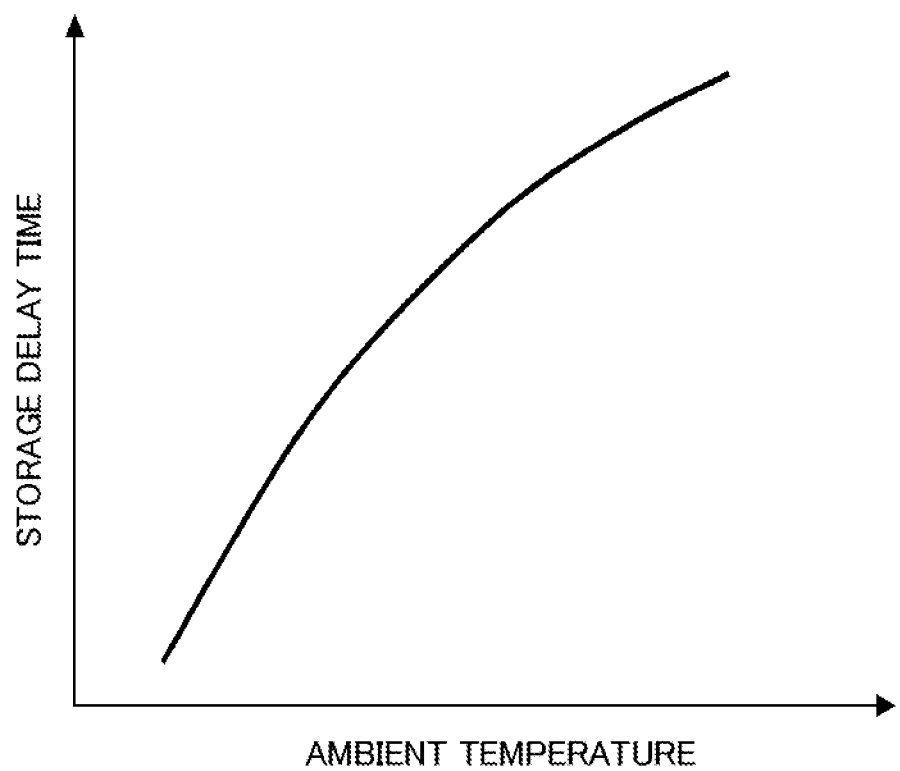
FIG. 4 shows the storage delay time of a transistor with respect to ambient temperature.

FIG. 4 shows the storage delay time of a transistor with respect to ambient temperature. Here, the storage delay time and temperature characteristic are described.

In FIG. 4, the horizontal axis indicates ambient temperature, and the vertical axis indicates storage delay time. As seen from FIG. 4, the storage delay time increases with increase in ambient temperature.

Furthermore, although the time tf till when the gate-source voltage of the first switching device 2 becomes equal to or less than the threshold, and the time tr till when the gate-source voltage of the second switching device 4 becomes equal to or more than the threshold may change due to variation in ambient temperature and components, the increase in the storage delay time due to increase in ambient temperature is larger than the change in tf and tr against time. Accordingly, when ambient temperature increases, the storage delay time is increases to increase the period B shown in FIG. 3, which avoids overlapping of the period A with the period C, allowing arm short circuit due to increase in ambient temperature to be prevented.

As described above, the switching device driving apparatus 1a in accordance with the first embodiment includes: the first signal input terminal 6 for controlling ON/OFF of the first switching device 2; the second signal input terminal 7 for controlling ON/OFF of the second switching device 4; the first switching device driving unit 3a for receiving a control signal from the first signal input terminal 6 and outputting an ON/OFF drive signal to the first switching device 2; and the second switching device driving unit 5a for, when ambient temperature is higher than a preset temperature, receiving a control signal from the second signal input terminal 7 and outputting an ON/OFF drive signal to the second switching device 4 such that the delay of the ON timing of the output control signal with respect to the ON timing of the control signal increases with increase in the temperature.

Then, the switching device driving apparatus 1a drives the switching apparatus 8. The switching apparatus 8 includes the first switching device 2 and the second switching device 4 connected in series. The first switching device 2 and the second switching device 4 are turned ON/OFF by the drive signals output from the switching device driving apparatus 1a and output a signal from the connecting point 11 of the first switching device 2 and the second switching device 4. The energy of the signal output from the connecting point 11 is stored in the reactor 9.

With this configuration, even when ambient temperature increases, the ON period of the second switching device 4 is delayed with respect to the ON period of the first switching device 2, allowing arm short circuit to be prevented.

In the embodiment described above, an N-channel MOSFET is used for the fourth switching device 17a included in the first switching device driving unit 3a. However, if the voltage of the power supply 10 fluctuates, the N-channel MOSFET may be replaced with a P-channel MOSFET. A specific example of this replacement is described below.

Figure 5:
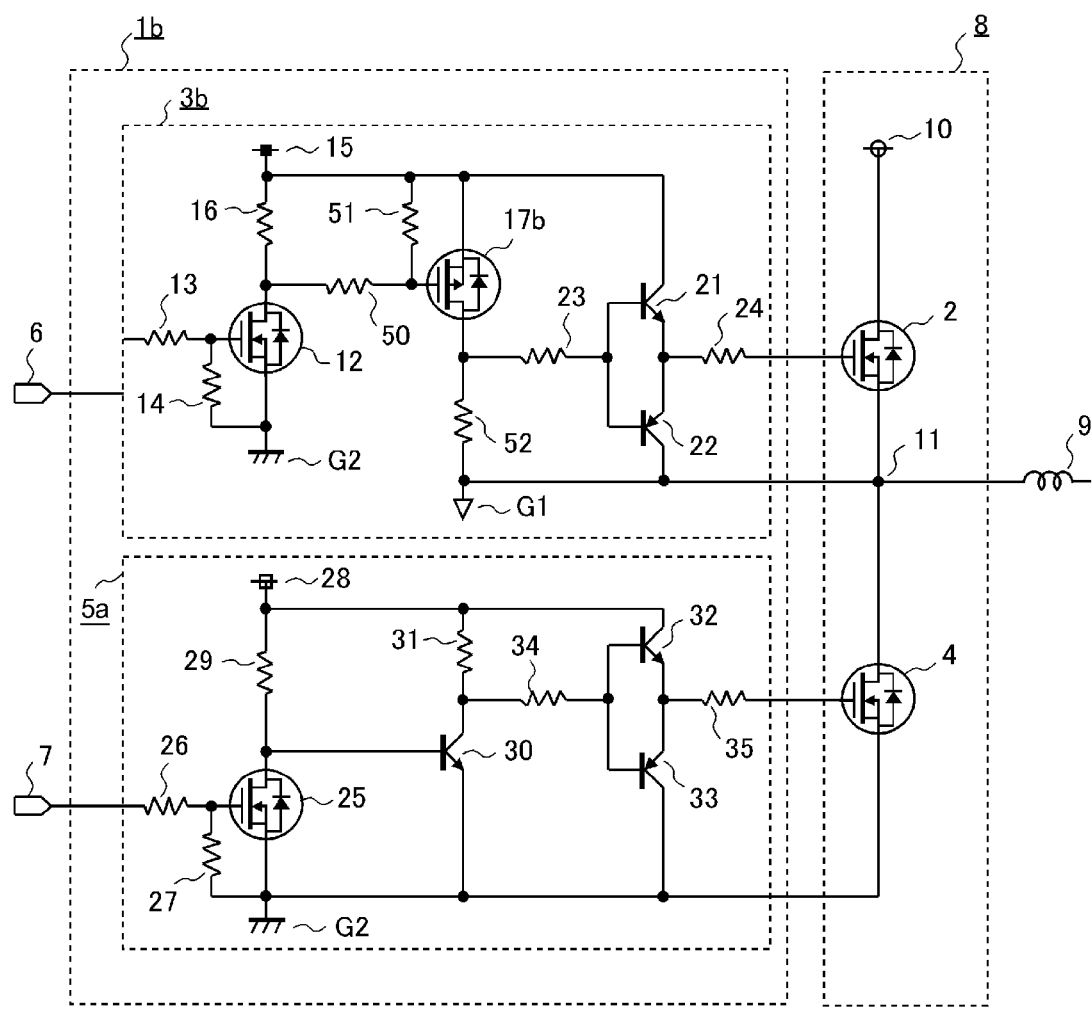
FIG. 5 is a circuit diagram showing another example of the switching device driving apparatus in accordance with the first embodiment of the invention.

FIG. 5 is a circuit diagram showing another example of the switching device driving apparatus in accordance with the first embodiment. FIG. 5 shows another example of the switching device driving apparatus 1b. The switching device driving apparatus 1b includes a fourth switching device 17b that is a P-channel MOSFET.

A first switching device driving unit 3b includes: a resistor 50 connected between the drain of the third switching device 12 and the gate of the fourth switching device 17b; a resistor 51 connected between the gate and the source of the fourth switching device 17b; and a resistor 52 connected between the ground G1 of the power supply 10 and the drain of the fourth switching device 17b to limit the drain-source current of the fourth switching device 17b. The remaining part of the configuration is similar to that of the embodiment shown in FIG. 1, and so is denoted by like numerals and will not be repeatedly described.

The fourth switching device 17b is connected to the drive power supply 15 with the gate driven by the resistors 50 and 51. And, the fourth switching device 17b outputs a signal to be converted to the drive voltage of the first switching device 2 according to the ON/OFF inverted signal from the third switching device 12.

According to the switching device driving apparatus 1b configured as above, since the fourth switching device 17b is also free from delay due to a storage delay time, the output signal is almost identical to that of the embodiment shown in FIG. 1, providing the same effect. In addition, using a P-channel MOSFET for the fourth switching device 17b provides another feature as described below.

When a switching power supply is used, the power supply has a mode of generating a counter-electromotive force in the reactor 9, which causes current to flow through the body diode of the second switching device 4 and the connecting point 11. As a result, a drop voltage corresponding to the resistance of the body diode of the second switching device 4 is generated at the ground G1 of the power supply 10. Specifically, when the counter-electromotive force is generated in the reactor 9 and the second switching device 4 is OFF, the potential of the ground G1 of the power supply 10 is negative by the drop voltage corresponding to the resistance of the body diode of the second switching device 4. Accordingly, when an N-channel MOSFET is used for the fourth switching device 17a as shown in FIG. 1, the reference potential with respect to the fourth switching device 17a is the ground G1, causing the gate-source voltage Vgs of the fourth switching device 17a to be positive in potential. At this time, if the voltage between the gate and the source of the fourth switching device 17a (drop voltage corresponding to the resistance of the body diode of the second switching device 4) exceeds the threshold of the fourth switching device 17a, the fourth switching device 17a will be ON.

This means that, even though the third switching device 12 is caused to turn ON in order to cause the first switching device 2 to turn ON, the fourth switching device 17a turns ON to cause the first switching device 2 to turn OFF. This phenomenon significantly occurs when the potential of the power supply 10 is close to the output voltage of the reactor 9, that is, when a step-down switching power supply is used and the ON time of the third switching device 12 is long, in other words, when the duty ratio of the third switching device 12 is close to 100%. Furthermore, the larger the current flowing through the body diode of the second switching device 4 and the connecting point 11 (output current of the reactor 9) is, the more significantly the phenomenon occurs.

On the other hand, when a P-channel MOSFET is used for the fourth switching device 17b as shown in FIG. 5, the fourth switching device 17b is driven when a negative voltage with respect to the drive power supply 15 is applied as the gate-source voltage Vgs. When the counter-electromotive force is generated in the reactor 9, even if the voltage of the ground G1 with respect to the fourth switching device 17b fluctuates, the reference potential for driving the fourth switching device 17b is given by the drive power supply 15, so the fourth switching device 17b can be stably driven.

Second Embodiment

Figure 6:
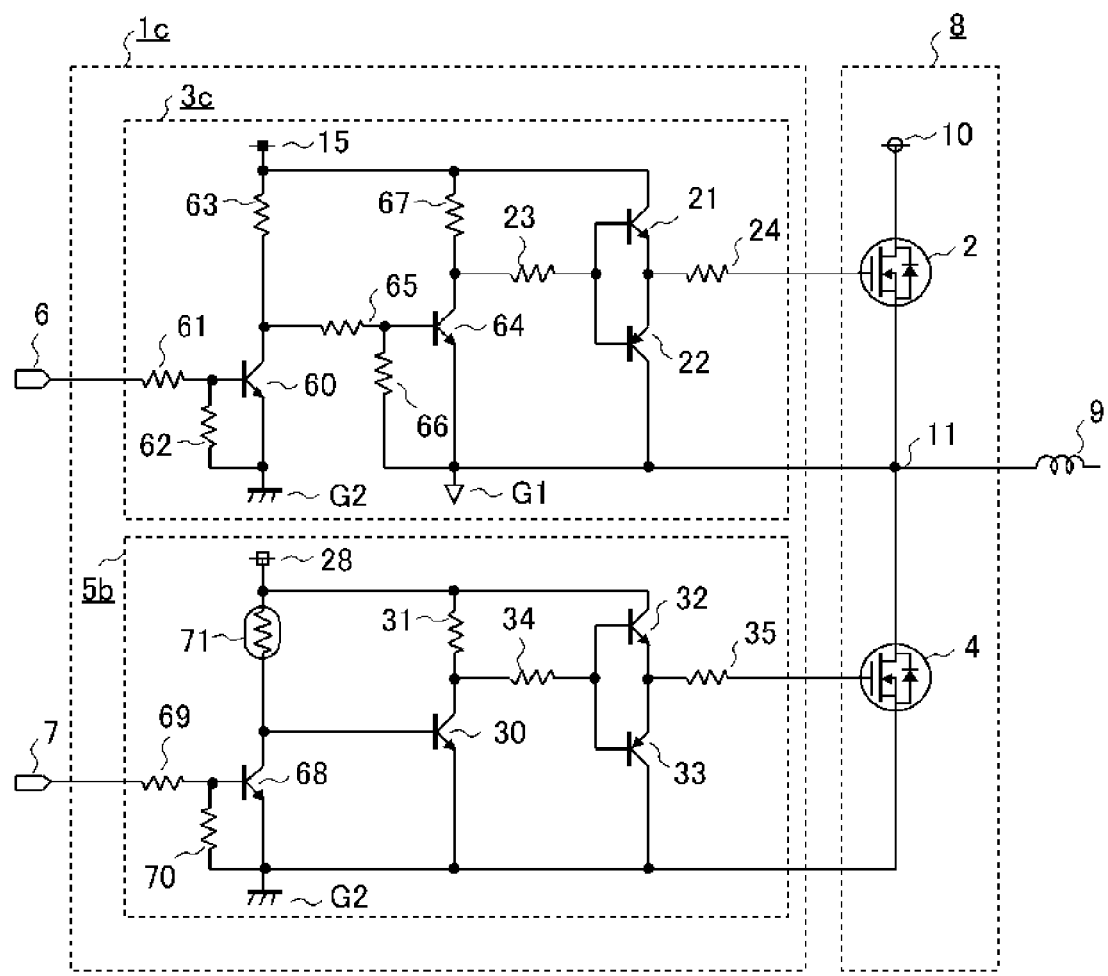
FIG. 6 is a circuit diagram showing an example of a switching device driving apparatus in accordance with a second embodiment of the invention.

Next, a switching device driving apparatus in accordance with a second embodiment of the invention is described. FIG. 6 is a circuit diagram showing an example of the switching device driving apparatus in accordance with the second embodiment. In FIG. 6, a switching device driving apparatus 1c in accordance with the second embodiment includes a first switching device driving unit 3c.

The first switching device driving unit 3c includes: a resistor 61 connected between the first signal input terminal 6 and the base of a sixth transistor 60; a resistor 62 connected between the base and the emitter of the sixth transistor 60; a resistor 63 connected between the drive power supply 15 and the collector of the sixth transistor 60 to limit the collector-emitter current of the sixth transistor 60; a resistor 65 connected between the collector of the sixth transistor 60 and the base of a seventh transistor 64; a resistor 66 connected between the base and the emitter of the seventh transistor 64; and a resistor 67 connected between the drive power supply 15 and the collector of the seventh transistor 64 to limit the collector-emitter current of the seventh transistor 64. The sixth and seventh transistors 60, 64 are N-channel bipolar transistors. The remaining part of the configuration of the first switching device driving unit 3c is similar to that of the first embodiment, and so is denoted by like numerals and will not be repeatedly described.

The sixth transistor 60 is driven by the resistors 61 and 62, and inverts ON/OFF of the control signal input from the first signal input terminal 6 to convert into the drive voltage of the first switching device 2. The seventh transistor 64 is driven by the resistors 65 and 66, and inverts the ON/OFF inverted signal from the sixth transistor 60 into a signal to be converted to the drive voltage of the first switching device 2.

Furthermore, a second switching device driving unit 5b includes: a resistor 69 connected between the second signal input terminal 7 and the base of a eighth transistor 68; a resistor 70 connected between the base and the emitter of the eighth transistor 68; and a thermister 71 that is connected between the drive power supply 28 and the collector of the eighth transistor 68 to limit the collector-emitter current of the eighth transistor 68 and the base current of the third transistor 30, and has a resistance value that decreases with increase in the temperature. The eighth transistor 68 is an N-channel bipolar transistor. The remaining part of the configuration of the second switching device driving unit 5b is similar to that of the first embodiment, and so is denoted by like numerals and will not be repeatedly described.

The eighth transistor 68 is driven by the resistors 69 and 70, and inverts ON/OFF of the control signal input from the second signal input terminal 7 to convert into the drive voltage of the second switching device 4.

Here, the relation of the storage delay time to the base current is described. When the amount of charge output from the base current is small, minority carrier storage effect becomes weak and stored carriers decrease, which decreases the storage delay time. So, the larger the base current is, the longer the storage delay time is.

In the second switching device driving unit 5b configured as above, with the resistance value of the thermister 71 set to the same as that of the resistor 63 at room temperature, the delay of the timing of achieving and breaking continuity between the drain and the source of the first switching device 2 with respect to ON/OFF of the control signal from the first signal input terminal 6 becomes equal to the delay of the timing of achieving and breaking continuity between the drain and the source of the second switching device 4 with respect to ON/OFF of the control signal from the second signal input terminal 7, which means that no relative delay exists.

In this state, if ambient temperature increases, the resistance value of the thermister 71 will decrease, causing the base current of the third transistor 30 to be increased. Accordingly, as shown in FIG. 3, when ambient temperature increases, the storage delay time is increases to increase the period B, which avoids overlapping of the period A with the period C, allowing arm short circuit due to increase in ambient temperature to be prevented.

As described above, the switching device driving apparatus 1c in accordance with the second embodiment includes: the first signal input terminal 6 for controlling ON/OFF of the first switching device 2; the second signal input terminal 7 for controlling ON/OFF of the second switching device 4; the first switching device driving unit 3c for receiving a control signal from the first signal input terminal 6 and outputting an ON/OFF drive signal to the first switching device 2; and the second switching device driving unit 5b for, when ambient temperature is higher than a preset temperature, receiving a control signal from the second signal input terminal 7 and outputting an ON/OFF drive signal to the second switching device 4 such that the delay of the ON timing of the output drive signal with respect to the ON timing of the control signal increases with increase in the temperature.

Then, the switching device driving apparatus 1c drives the switching apparatus 8. The switching apparatus 8 includes the first switching device 2 and the second switching device 4 connected in series. The first switching device 2 and the second switching device 4 are turned ON/OFF by the drive signals output from the switching device driving apparatus 1c and output a signal from the connecting point 11 of the first switching device 2 and the second switching device 4. The energy of the signal output from the connecting point 11 is stored in the reactor 9.

With this configuration, even when ambient temperature increases, the ON period of the second switching device 4 is delayed with respect to the ON period of the first switching device 2, allowing arm short circuit to be prevented.

Third Embodiment

Figure 7:
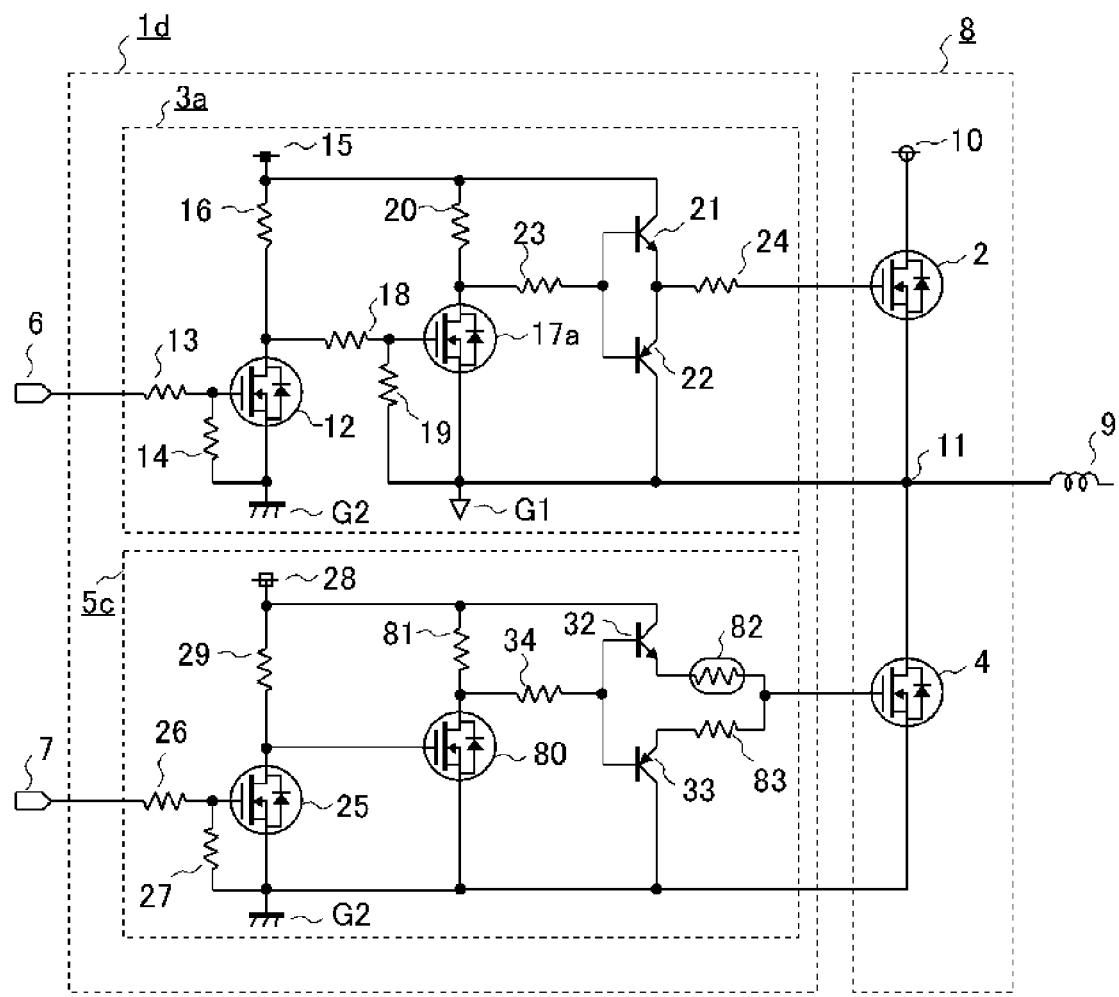
FIG. 7 is a circuit diagram showing an example of a switching device driving apparatus in accordance with a third embodiment of the invention.

Next, a switching device driving apparatus in accordance with a third embodiment of the invention is described. FIG. 7 is a circuit diagram showing an example of the switching device driving apparatus in accordance with the third embodiment. FIG. 7 shows a switching device driving apparatus 1d in accordance with the third embodiment, including a second switching device driving unit 5c.

The second switching device driving unit 5c includes: a sixth switching device 80; a resistor 81 connected between the drive power supply 28 and the drain of the sixth switching device 80 to limit the drain-source current of the sixth switching device 80; a thermister 82 connected between the emitter of the fourth transistor 32 and the gate of the second switching device 4; and a resistor 83 connected between the emitter of the fifth transistor 33 and the gate of the second switching device 4.

The sixth switching device 80 is an N-channel MOSFET, and inverts the ON/OFF inverted signal from the fifth switching device 25 into a signal to be converted to the drive voltage of the second switching device 4. The resistor 83 limits the discharge amount of the gate current of the second switching device 4 to adjust the switching speed of the falling of the gate-source voltage (input signal: Vgs) of the second switching device 4. Furthermore, the thermister 82 limits the charge amount of the gate current of the second switching device 4. And, with increase in the temperature, the resistance value of the thermister 82 becomes larger than that of the resistor 83 to cause the switching speed of the rising of the gate-source voltage (input signal: Vgs) of the second switching device 4 to be slower than that at room temperature. Note that the remaining part of the configuration of the switching device driving apparatus 1d is similar to that of the first embodiment, and so is denoted by like numerals and will not be repeatedly described.

Figure 8:
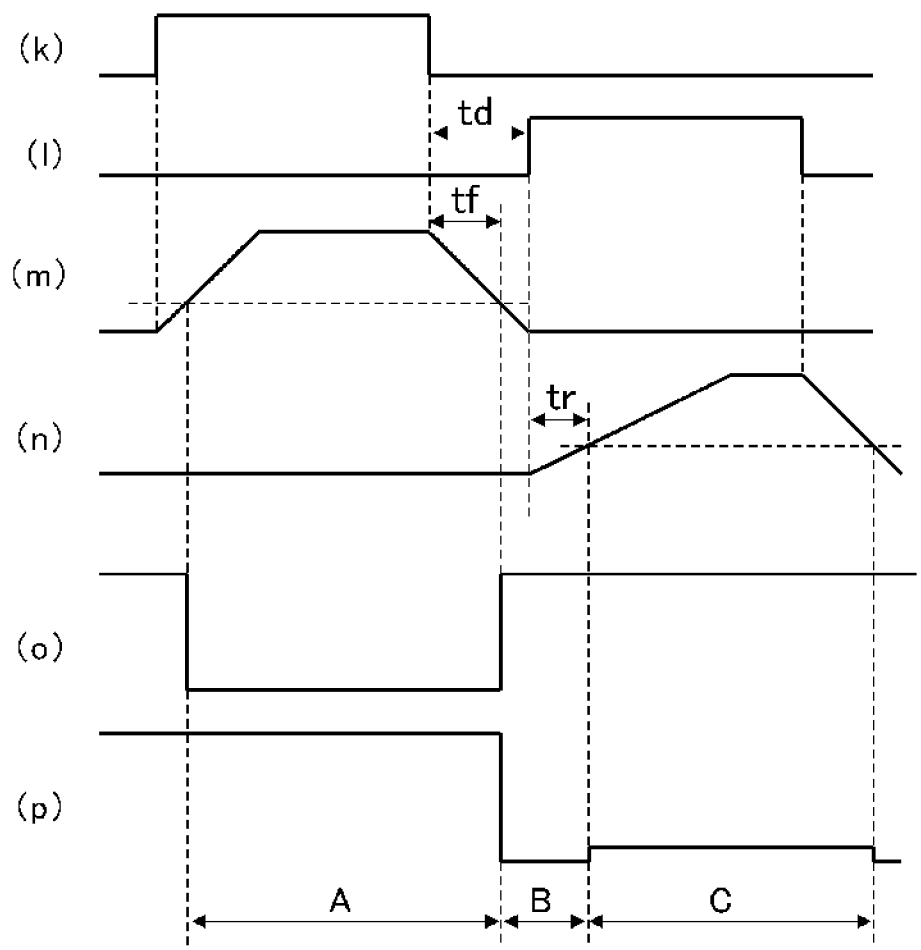
FIG. 8 is a timing chart showing the operation of the switching device driving apparatus and a switching apparatus driven by the switching device driving apparatus in accordance with the third embodiment of the invention.

FIG. 8 is a timing chart showing the operation of the switching device driving apparatus 1d and the switching apparatus 8 in accordance with the third embodiment.

In FIG. 8, the signals (k)-(m), (o) and (p) are the same as the signals (e)-(g), (i) and (j) in the first embodiment shown in FIG. 3, and the signal (n) shows the gate-source voltage (input signal: Vgs) of the second switching device 4.

Here, the relation of the switching speed of the switching device to the charge amount of the gate current is described. A MOSFET has an input parasitic capacitance. With the constant input parasitic capacitance, if the charge amount of the gate current is small, the switching speed of the rising of the gate-source voltage of the switching device is low, and if the charge amount of the gate current is large, the switching speed of the rising of the gate-source voltage of the switching device is high.

Therefore, since the resistance value of the thermister 82 increases with increase in the temperature, the charge amount of the gate current of the second switching device 4 becomes smaller than that at room temperature, causing the switching speed of the rising of the gate-source voltage Vgs of the second switching device 4 to be lower. Accordingly, it takes longer for the gate-source voltage Vgs to reach a threshold voltage at which continuity is achieved between the drain and the source of the second switching device 4 (i.e., achieving continuity between the drain and the source will be delayed).

Thus, the period B shown in FIG. 8 increases, which avoids overlapping of the period A with the period C, allowing arm short circuit due to increase in ambient temperature to be prevented.

As described above, the switching device driving apparatus 1d in accordance with the third embodiment includes: the first signal input terminal 6 for controlling ON/OFF of the first switching device 2; the second signal input terminal 7 for controlling ON/OFF of the second switching device 4; the first switching device driving unit 3a for receiving a control signal from the first signal input terminal 6 and outputting an ON/OFF drive signal to the first switching device 2; and the second switching device driving unit 5c for, when ambient temperature is higher than a preset temperature, receiving a control signal from the second signal input terminal 7 and outputting an ON/OFF drive signal to the second switching device 4 such that the delay of the ON timing of the output drive signal with respect to the ON timing of the control signal increases with increase in the temperature.

Then, the switching device driving apparatus 1d drives the switching apparatus 8. The switching apparatus 8 includes the first switching device 2 and the second switching device 4 connected in series. The first switching device 2 and the second switching device 4 are turned ON/OFF by the drive signals output from the switching device driving apparatus 1d and output a signal from the connecting point 11 of the first switching device 2 and the second switching device 4. The energy of the signal output from the connecting point 11 is stored in the reactor 9.

With this configuration, even when ambient temperature increases, the ON period of the second switching device 4 is delayed with respect to the ON period of the first switching device 2, allowing arm short circuit to be prevented.

In the embodiment described above, the configuration is used in which the thermister 82 is connected between the emitter of the fourth transistor 32 included in the second switching device driving unit 5c and the gate of the second switching device 4 and the resistor 83 is connected between the emitter of the fifth transistor 33 and gate of the second switching device 4. However, another configuration may be used in which the emitter of the fourth transistor 32 is connected to the emitter of the fifth transistor 33 and then a diode, a resistor and a thermister are used. A specific example of this configuration is described below.

Figure 9:
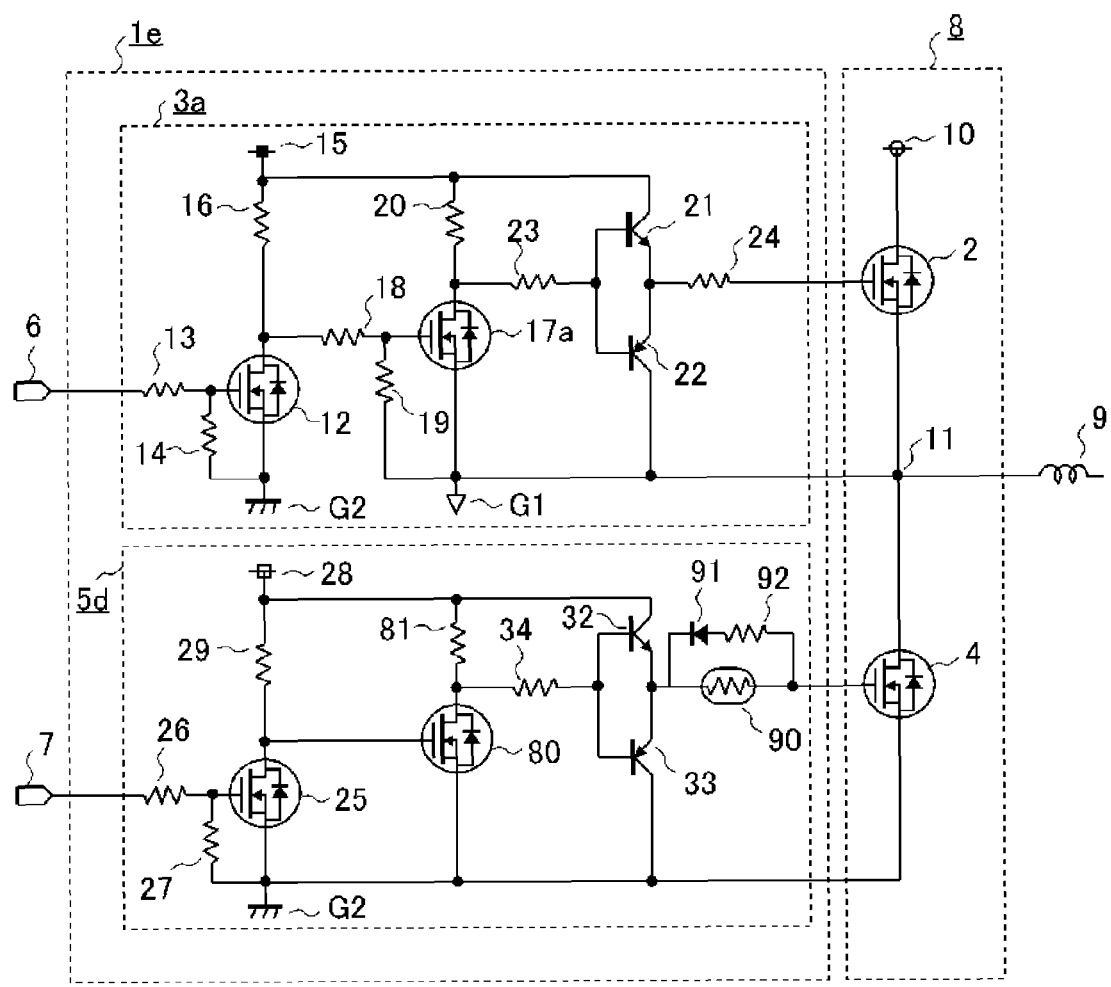
FIG. 9 is a circuit diagram showing another example of the switching device driving apparatus in accordance with the third embodiment of the invention.

FIG. 9 is a circuit diagram showing another example of the switching device driving apparatus in accordance with the third embodiment. In FIG. 9, the emitter of the fourth transistor 32 is connected to the emitter of the fifth transistor 33. FIG. 9 shows another example 1e of the switching device driving apparatus in accordance with the third embodiment, which includes a thermister 90, a diode 91 and a resistor 92.

The thermister 90 is connected between the emitters of the fourth and fifth transistors 32, 33 and the gate of the second switching device 4. The diode 91 and the resistor 92 are connected in series. This series connection is connected to the thermister 90 in parallel. The remaining part of the configuration is similar to that of the embodiment shown in FIG. 7, and so is denoted by like numerals and will not be repeatedly described.

The thermister 90 limits the charge amount of the gate current of the second switching device 4. And, with increase in the temperature, the resistance value of the thermister 90 becomes larger than that of the resistor 92 to cause the switching speed of the rising of the gate-source voltage Vgs of the second switching device 4 to be slower than that at room temperature. The diode 91 has a cathode connected to the emitters of the fourth and fifth transistors 32, 33 and an anode connected to the resistor 92, and is conductive when the gate current of the second switching device 4 is discharged. The resistor 92 limits the discharge amount of the gate current of the second switching device 4 to adjust the switching speed of the falling of the gate-source voltage Vgs of the second switching device 4.

According to the switching device driving apparatus 1e configured as above, since the resistance value of the thermister 90 increases with increase in the temperature, the charge amount of the gate current of the second switching device 4 becomes smaller than that at room temperature, causing the switching speed of the rising of the gate-source voltage Vgs of the second switching device 4 to be lower. Accordingly, it takes longer for the gate-source voltage Vgs to reach the threshold voltage at which continuity is achieved between the drain and the source of the second switching device 4 (i.e., achieving continuity between the drain and the source will be delayed). Thus, the output signal is almost identical to that in the embodiment shown in FIG. 7, providing the same effect.

In the embodiment described above, the thermister 90 is connected between the emitters of the fourth and fifth transistors 32, 33 and the gate of the second switching device 4. However, the ON switching speed of the second switching device 4 may be decreased also by connecting the thermister 90 to the base or collector of the fourth transistor 32 to cause the charge amount of the gate current of the second switching device 4 to be decreased with increase in the temperature. So, the thermister 90 may not necessarily be connected to the gate of the second switching device 4.

Furthermore, in the first to third embodiments, the ON/OFF drive signal is output to the second switching device 4 such that the delay of the ON timing of the drive signal output from the second switching device driving units 5a-5d with respect to the ON timing of the control signal from the second signal input terminal 7 increases with increase in the temperature. This concept may also be applied to the first switching device driving units 3a-3c.

Furthermore, this concept may also be applied to both of the first switching device driving units 3a-3c and the second switching device driving units 5a-5d.

Specifically, by delaying the ON timing of the output signal of the second switching device driving units 5a-5d with respect to the OFF timing of the output signal of the first switching device driving units 3a-3c when ambient temperature increases, the ON period of the second switching device 4 is delayed with respect to the ON period of the first switching device 2 to prevent arm short circuit. Or, by decreasing the ON switching speed of the output signal of the second switching device driving units 5a-5d with respect to the OFF switching speed of the output signal of the first switching device driving units 3a-3c when ambient temperature increases, the ON period of the second switching device 4 is delayed with respect to the ON period of the first switching device 2 to prevent arm short circuit.

In addition, by delaying the ON timing of the output signal of the first switching device driving units 3a-3c with respect to the OFF timing of the output signal of the second switching device driving units 5a-5d when ambient temperature increases, the ON period of the first switching device 2 is delayed with respect to the ON period of the second switching device 4 to prevent arm short circuit. Or, by decreasing the ON switching speed of the output signal of the first switching device driving units 3a-3c with respect to the OFF switching speed of the output signal of the second switching device driving units 5a-5d when ambient temperature increases, the ON period of the first switching device 2 may be delayed with respect to the ON period of the second switching device 4 to prevent arm short circuit.

In the above embodiments, a signal input to the first signal input terminal 6 and the second signal input terminal 7 can be provided using the combination of a microprocessor, a logic circuit and the like.

Also, in the above embodiments, a MOSFET is used as an example of a switching device. However, the control may be performed also using a switching device including an IGBT, not necessarily limited to a MOSFET.

Furthermore, in the second and third embodiments, a thermister is used as an example of a resistor having a resistance value varying depending on ambient temperature. However, resistors having different temperature coefficients may be used to provide difference in resistance value due to increase in ambient temperature, which is not necessarily limited to a thermister.

The invention may be embodied by appropriately combining, modifying or partially omitting the embodiments without departing from the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A switching device driving apparatus for performing synchronous rectification control of first and second switching devices connected in series included in a switching apparatus, the switching device driving apparatus comprising:
   a first control signal input terminal to which a control signal of the first switching device is input;
   a second control signal input terminal to which a control signal of the second switching device is input;
   a first switching device driving unit for receiving the control signal from the first control signal input terminal and outputting an ON/OFF drive signal to the first switching device, the first switching device driving unit comprising a thermistor, a diode, and a resistor, the thermistor being arranged in a parallel path connection with the diode and the resistor for varying a resistance value of the parallel path connection depending on ambient temperature, the drive signal for decreasing the ON switching speed with the increase in the ambient temperature corresponding with the resistance value varying; and
   a second switching device driving unit for receiving the control signal from the second control signal input terminal and outputting an ON/OFF drive signal to the second switching device,
   wherein the control signals input to the first and second control signal input terminals are control signals for controlling the first switching device and the second switching device so that they will not turn ON at the same time,
   wherein the first switching device driving unit outputs a drive signal for decreasing the ON switching speed of the first switching device with respect to the OFF switching speed of the second switching device with an increase in ambient temperature.

2. The switching device driving apparatus according to claim 1, wherein the second switching device driving unit outputs a drive signal for decreasing the ON switching speed of the second switching device with respect to the OFF switching speed of the first switching device with the increase in the ambient temperature.

3. A switching device driving apparatus for performing synchronous rectification control of first and second switching devices connected in series included in a switching apparatus, the switching device driving apparatus comprising:
   a first control signal input terminal to which a control signal of the first switching device is input;
   a second control signal input terminal to which a control signal of the second switching device is input;
   a first switching device driving unit for receiving the control signal from the first control signal input terminal and outputting an ON/OFF drive signal to the first switching device, the first switching device driving unit comprising a thermistor, a diode, and a resistor, the thermistor being arranged in a parallel path connection with the diode and the resistor for varying a resistance value of the parallel path connection depending on ambient temperature, the drive signal for decreasing the ON switching speed with the increase in the ambient temperature corresponding with the resistance value varying; and
   a second switching device driving unit for receiving the control signal from the second control signal input terminal and outputting an ON/OFF drive signal to the second switching device,
   wherein the control signals input to the first and second control signal input terminals are control signals for controlling the first switching device and the second switching device so that they will not turn ON at the same time,
   wherein the second switching device driving unit outputs a drive signal for decreasing the ON switching speed of the second switching device with respect to the OFF switching speed of the first switching device with an increase in ambient temperature.

4. A switching device driving apparatus for performing synchronous rectification control of first and second switching devices connected in series included in a switching apparatus, the switching device driving apparatus comprising:
   a first control signal input terminal to which a control signal of the first switching device is input;
   a second control signal input terminal to which a control signal of the second switching device is input;

a first switching device driving unit for receiving the control signal from the first control signal input terminal and outputting an ON/OFF drive signal to the first switching device; and a second switching device driving unit for receiving the control signal from the second control signal input terminal and outputting an ON/OFF drive signal to the second switching device, wherein the control signals input to the first and second control signal input terminals are control signals for controlling the first switching device and the second switching device so that they will not turn ON at the same time, wherein the first switching device driving unit outputs a drive signal for decreasing the ON switching speed of the first switching device with respect to the OFF switching speed of the second switching device with an increase in ambient temperature, wherein the driving signal for decreasing the ON switching speed with the increase in the ambient temperature corresponds to a resistance value varying depending on the ambient temperature, and wherein the first switching device driving unit has a different hardware configuration than the second switching device driving unit.

* * * * *